US008872549B2

(12) United States Patent
Herrera et al.

(10) Patent No.: US 8,872,549 B2
(45) Date of Patent: Oct. 28, 2014

(54) ANALOG MINIMUM OR MAXIMUM VOLTAGE SELECTOR CIRCUIT

(71) Applicants: Sandro Herrera, Medford, MA (US); Moshe Gerstenhaber, Newton, MA (US)

(72) Inventors: Sandro Herrera, Medford, MA (US); Moshe Gerstenhaber, Newton, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 13/770,880

(22) Filed: Feb. 19, 2013

(65) Prior Publication Data
US 2014/0232435 A1    Aug. 21, 2014

(51) Int. Cl.
*H03K 5/153*    (2006.01)
*G01R 19/04*    (2006.01)

(52) U.S. Cl.
CPC ........................ *G01R 19/04* (2013.01)
USPC ........................................................... 327/58

(58) Field of Classification Search
USPC .................................................. 327/58, 62
See application file for complete search history.

(56) References Cited

U.S. PATENT DOCUMENTS 5,432,478 A * 7/1995 Gilbert ......................... 330/284
6,496,525 B1 * 12/2002 Kimura ...................... 372/38.02
6,958,644 B2 * 10/2005 Palaskas et al. ............... 327/553

* cited by examiner

*Primary Examiner* — William Hernandez
(74) *Attorney, Agent, or Firm* — Kenyon & Kenyon LLP (57) ABSTRACT

A circuit includes multiple input sub-circuits coupled to a common output node. Each input sub-circuit includes a transconductance cell. A diode is coupled between the output of the transconductance cell and a common output node. A feedback circuit is coupled between the common output node and a second input of the transconductance cell. A voltage follower is coupled between the common output node and a reference voltage, with an input coupled to the output of the transconductance cell.

20 Claims, 10 Drawing Sheets

ANALOG MINIMUM OR MAXIMUM VOLTAGE SELECTOR CIRCUIT

BACKGROUND

In analog control systems, there may be a need to allow different circuit paths to set a control voltage at a common output at different times. Therefore, there may be a need for a circuit that can detect the control voltages of each circuit path to determine an overall control voltage. For example, in negative feedback systems, the overall control voltage may be set to a minimum voltage from among multiple control voltages. A maximum voltage may be used in other applications.

As an example application of an analog control system, in battery conditioning systems, two separate circuit paths may be used to control a power converter that charges and discharges a battery. One loop may be a current-controlled circuit path while the other may be a voltage-controlled circuit path. During a charging process, these loops may compete to control the battery's charging current by trying set the power converter's control voltage. A minimum selector circuit may select which circuit path controls the power converter.

A variety of minimum selector circuits or maximum selector circuits are known. A conventional minimum or maximum voltage detecting circuit may have the drawback that, the transfer function from any input of the circuit to the output cannot be easily altered. As such, any different transfer function may need to be implemented with additional circuitry, thus increasing the complexity and cost of the overall circuit and system.

Some circuit architectures may have long transition times. They may have intermediate outputs that are driven to the supply rail (+/−15V, for example), which increases the transition time required to switch from a previously output of a minimum or maximum voltage to a new output minimum or maximum voltage. Increases in the transition time may cause voltage errors at the output of the selector circuit which can degrade the performance of the overall system.

Thus, there may be a need for new minimum or maximum voltage detecting circuits and systems that can implement any transfer functions in their feedback circuit, while having low transition time in switching and better overall speed performance.

DETAILED DESCRIPTION

Embodiments of the present invention provide a circuit that includes multiple input sub-circuits having outputs coupled to a common output node. Each input sub-circuit includes a transconductance cell having a differential input voltage signal and an output current signal. A diode may be coupled between the output of the transconductance cell and the common output node. A feedback circuit may be coupled between the common output node and an input of the transconductance cell. A voltage follower may be coupled between the common output node, the output of the transconductance cell and a reference voltage, with a voltage input coupled to the output of the transconductance cell, a voltage output coupled to the common output node and a common terminal coupled to a reference voltage.

Other embodiments of the present invention provide a circuit that includes multiple input sub-circuits coupled to a common output node. Each input sub-circuit includes a transconductance cell having a differential input voltage signal and an output current signal. A feedback circuit may be coupled between the common output node and an input of the transconductance cell. A voltage follower may be coupled between the common output node, the output of the transconductance cell and a reference voltage, with a voltage input coupled to the output of the transconductance cell, a voltage output coupled to the common output node and a common terminal coupled to the reference voltage. For each pair of input sub-circuits, a pair of diodes may be connected in parallel and oppositely oriented relative to each other, coupling between the outputs of the transconductance cells.

Each of the input sub-circuits may perform a predetermined transfer function which can be set with a local feedback circuit. Therefore, the behavior of the minimum or maximum selector circuit may be described mathematically by:

$$V_{OUT} = \text{MIN}[F_1(V_{IN1}, I_{IN1}), F_2(V_{IN2}, I_{IN2}), F_3(V_{IN3}, I_{IN3}), \ldots, F_N(V_{INN}, I_{INN})], \quad \text{Eq. 1}$$

$$V_{OUT} = \text{MAX}[F_1(V_{IN1}, I_{IN1}), F_2(V_{IN2}, I_{IN2}), F_3(V_{IN3}, I_{IN3}), \ldots, F_N(V_{INN}, I_{INN})] \quad \text{Eq. 2}$$

where $V_{IN1}$-$V_{INN}$ are voltage inputs, $I_{IN1}$-$I_{INN}$ are current inputs, and $F_1$-$F_N$ are the transfer functions of the input sub-circuits.

Figure 1A:
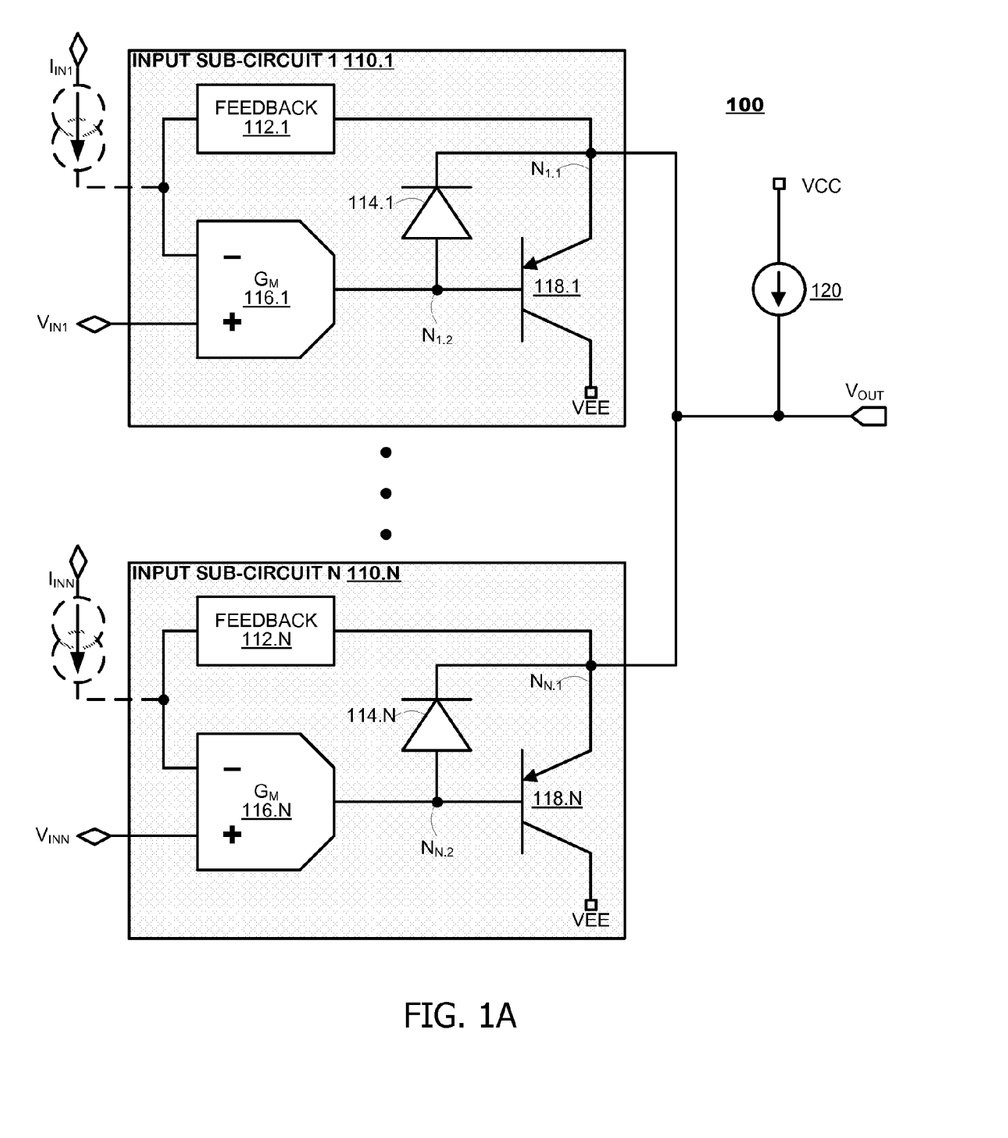
FIG. 1A illustrates a circuit according to an embodiment of the present disclosure.

FIG. 1A illustrates a multi-input minimum output voltage selector circuit 100 according to an embodiment of the present disclosure. In the embodiment, the circuit 100 may include a plurality of commonly-constructed input sub-circuits 110.1-110.N, each coupled to a respective input voltage signal $V_{IN1}$-$V_{INN}$. Each input sub-circuits 110.1-110.N may include respective input current signal $I_{IN1}$-$I_{INN}$. The input sub-circuits 110.1-110.N may have outputs (shown as $N_{1.1}, \ldots, N_{N.1}$ respectively) that are coupled to a common output node $V_{OUT}$. A bias current source 120 may be coupled to a common output node $V_{OUT}$. In the example of FIG. 1A, only two input sub-circuits are shown in detail but the principles of the present invention may include an arbitrary number of N input sub-circuits (not shown).

Each input sub-circuit (for example, stage 110.1) may include a transconductance cell 116.1, a diode 114.1, a feedback circuit 112.1, and a voltage follower 118.1. The transconductance cell 116.1 may have a non-inverting input coupled to a terminal for an input voltage signal $V_{IN1}$ and an inverting input coupled to a terminal for an input current signal $I_{IN1}$. An output of the transconductance cell (shown as node $N_{1.2}$) may be coupled to a voltage input of the voltage follower 118.1 and to the anode of the diode 114.1. The cathode of the diode 114.1 (node $N_{1.1}$) may be connected to the output node $V_{OUT}$, to the feedback circuit 112.1 and to a voltage output of the voltage follower 118.1. A second terminal of the feedback circuit 112.1 may be connected to an inverting input of the transconductance cell 116.1. The voltage follower 118.1 may return current injected into the input sub-circuit's output $N_{1.1}$ to a reference voltage shown as VEE.

Feedback circuits 112.1-112.N of the input sub-circuits 110.1-110.N may determine a transfer function for each input sub-circuit 110.1-110.N that is imparted to input signals $V_{IN1}$-$V_{INN}$ and $I_{IN1}$-$I_{INN}$. Therefore, feedback circuits 112.1-112.N, and input signals $V_{IN1}$-$V_{INN}$ and may determine the voltage being driven by an input sub-circuit on output node $V_{OUT}$. The transfer function of each input sub-circuit may include delays, multiplication, clamping, amplification, integration, differentiation, filtering, etc.

Consider the circuit 100 operating according to Eq. 1, where input sub-circuit 110.1 drives its output node $N_{1.1}$ toward a potential output voltage that is lower than the output voltages driven by the other input sub-circuits. Since all the output nodes of the input sub-circuits are coupled together at node $V_{OUT}$, the input sub-circuits will compete to set overall output voltage of the common node $V_{OUT}$. Due to their high current sinking nature, each voltage follower 118.1-118.N may only actively pull down the voltage of the common node $V_{OUT}$ toward the respective potential output voltages of the input sub-circuits. Thus, the voltage at node $V_{OUT}$ may only be the minimum of the output voltages driven by the input sub-circuits, in this case the output voltage driven by input sub-circuit 110.1. Since all input sub-circuits other than 110.1 may be trying to drive the voltage at node $V_{OUT}$ to higher potential output voltages, the respective transconductance cells of all input sub-circuits other than 110.1 may source a limited current to pull up the input voltage of their respective voltage followers. As a result, the voltage follower 118.1 may be on, while all others may be off, diode 114.1 may be reversed biased, while all other diodes may be forward biased. Thus, input sub-circuit 110.1 may be considered as active, while all other sub-circuits may be considered as inactive. The forward biased diodes 114.1-114.N may clamp the voltage input of the respective voltage followers 118.1-118.N in the inactive input sub-circuits at approximately the output $V_{OUT}$+VF (where VF represents the forward biasing voltage of the respective diodes 114.1-114.N) and may channel the limited current sourced by transconductance cell 116.N (and from other transconductance cells of all other inactive input sub-circuits) to output node $V_{OUT}$ and to the output of voltage follower 118.1. The voltage follower 118.1 may channel the current in the forward biased diodes 114.1-114.N to voltage node VEE.

Figure 1B:
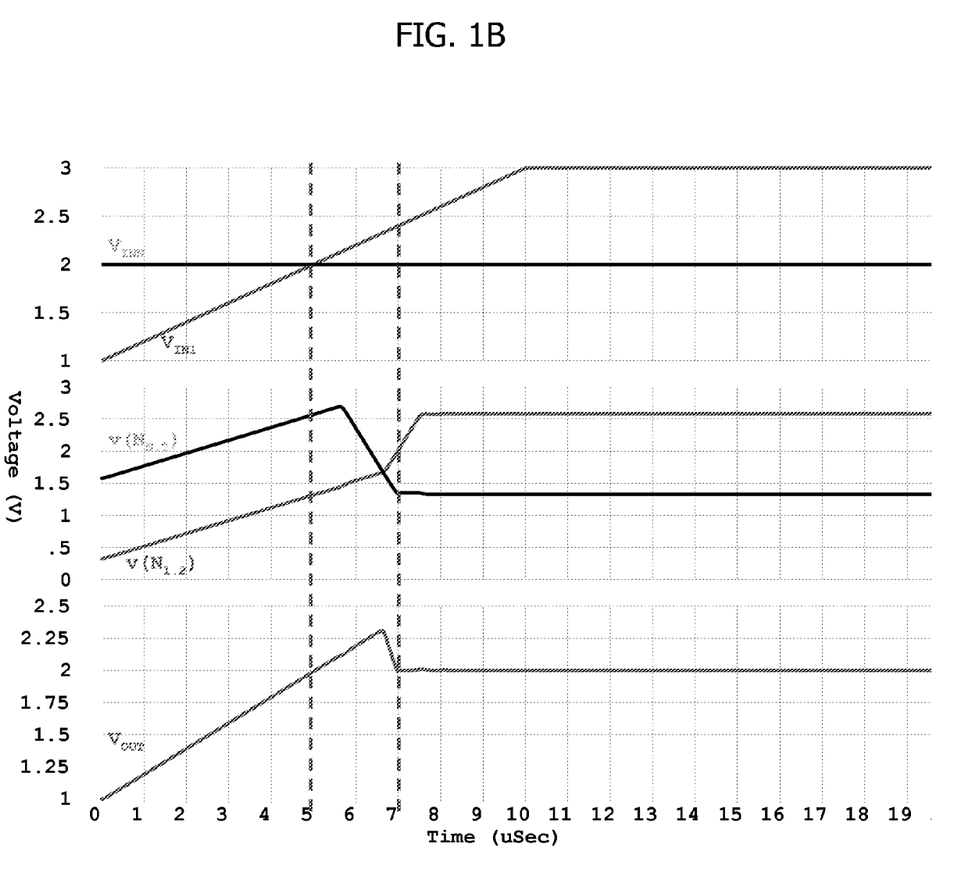
FIG. 1B illustrates a plot of voltage switching characteristics of the circuit of FIG. 1A according to an embodiment of the present disclosure.

FIG. 1B illustrates an exemplary plot of voltage switching characteristics of the circuit 100 of FIG. 1A according to an embodiment of the present disclosure, where the feedback circuit may be a wire, and there are two sub-circuits, N=2. Thus, the circuit performs the function of a selector of the lower of two input voltages (respectively $V_{IN1}$ and $V_{INN}$).

The top plot of FIG. 1B illustrates the input voltage $V_{IN1}$ being swept from 1 volt to 3 volts, and $V_{INN}$ being held constant at 2 volts. The middle plot of FIG. 1B illustrates that the intermediate outputs (respectively $N_{1.2}$, $N_{N.2}$) quickly cross each other in voltage and transitions in voltage after the input voltage $V_{IN1}$ crosses input voltage $V_{INN}$. The intermediate outputs (respectively $N_{1.2}$, $N_{N.2}$) also do not rise or fall near the supply voltage potentials, and may be generally clamped near the voltage of common output node $V_{OUT}$, because of the operation of the diodes. The lower plot of FIG. 1B illustrates that the voltage of common node $V_{OUT}$ settles at the minimum voltage between $V_{IN1}$ and $V_{INN}$ after a small transition period (between two vertical dash lines) after the input voltage $V_{IN1}$ crosses input voltage $V_{INN}$.

For example, as $V_{IN1}$ rises from 1 volt toward 2 volts between 0 and 5 uSec, the voltage of intermediate output $N_{1.2}$ may rise from 0.3 volt toward 1.3 volts to track generally to $V_{IN1}$. During that time period, because $V_{INN}$ is higher than $V_{IN1}$, the voltage follower 118.1 may be on, the voltage follower 118.N may be off, the voltage of intermediate output $N_{N.2}$ may be clamped by the diode 114.N at approximately $V_{OUT}$+VF, and the output $V_{OUT}$ may be set at approximately $V_{IN1}$. The voltage of intermediate output $N_{N.2}$ may rise higher than $V_{INN}$, due to the forward biasing voltage VF of the diode 114.N.

Between 5 and 7 uSec, as $V_{IN1}$ rises above $V_{INN}$, the voltage at the non-inverting terminal of the transconductance cell 116.N falls below the voltage at its inverting terminal. Thus, the transconductance cell 116.N pulls down the voltage of node $N_{N.2}$. Decreasing the voltage at $N_{N.2}$ with respect to $V_{OUT}$, turns on the voltage follower 118.N and turns off the diode 114.N. The voltage follower 118.N pulls the voltage of node $V_{OUT}$ down to approximately equal to $V_{INN}$. As the voltage $V_{OUT}$ falls below $V_{IN1}$, the voltage at the inverting terminal of the transconductance cell 116.1 falls below the voltage at its non-inverting terminal. Therefore, the transconductance cell 116.1 pulls up the voltage of intermediate output $N_{1.2}$, the voltage follower 118.1 turns off, and the diode 114.1 forward biases.

Beyond 7 uSec, as $V_{IN1}$ rises further above $V_{INN}$, the voltage of intermediate output $N_{N.2}$ begins to track $V_{OUT}$ and $V_{INN}$. As the diode 114.1 forward biases and input sub-circuit 110.N takes control of the output $V_{OUT}$, the voltage of intermediate output $N_{1.2}$ is clamped by the diode 114.1 at approximately $V_{OUT}$+VF.

According to an embodiment, the voltage followers 118.1-118.N may include a PNP Bipolar Junction Transistor (PNP transistor, transistor, BJT). The output (respectively $N_{1.2}$, $N_{N.2}$) of the transconductance cell may be connected to the anode of a diode (respectively 114.1, 114.N), and to the base of a PNP Bipolar Junction Transistor (respectively 118.1, 118.N). The collector of the BJT may be connected to a low potential voltage supply (VEE). The cathode of the diode (respectively 114.1, 114.N) may be connected to the other terminal of the feedback network (respectively 112.1, 112.N), to the emitter of the BJT, to the output of the sub-circuit (respectively $N_{1.1}$, $N_{N.1}$), and to the common output ($V_{OUT}$).

In another embodiment, the voltage followers (respectively 118.1, 118.N) may include a P-type Metal-Oxide-Semiconductor Field Effect transistor (PMOSFET) or a P-channel Junction Field-Effect Transistor (P-JFET) or other types of Field-Effect Transistor (FET), where the gate of the MOSFET or JFET transistor may be connected to the output of the transconductance cell, the source may be connected to the common output node, and the drain may be connected to the reference voltage VEE.

In another embodiment, the diodes (respectively 114.1, 114.N) may each be provided by a diode connected transistor. For example, each diode may be a P-type MOSFET or a P-channel JFET with a drain connected to a gate as cathode of the diode, and a source as an anode of the diode, or alternatively, a N-type MOSFET or a N-channel JFET with a drain connected to a gate as an anode of the diode, and a source as a cathode of the diode. Each diode may be a PNP Bipolar Junction Transistor with the collector and the base connected as a cathode of the diode, and an emitter connected as an anode, or alternatively, a NPN Bipolar transistor with the collector and the base connected as a cathode of the diode, and an emitter connected as an anode.

MOS transistor implementation of the circuit in accordance with the embodiments of the present disclosure may allow integration of the circuit components on semiconductor chips, by using a CMOS semiconductor manufacturing process, to reduce size and cost of the circuit and the overall system.

Each transconductance cell (respectively 116.1, 116.N) may generate an output current at its output node (respectively $N_{1.1}$, $N_{N.1}$) proportional to the differential input voltage presented to it up to a design limit, and may limit current sourcing, i.e. limits the generated output current flowing out of the transconductance cell to be significantly lower than the maximum emitter current of the transistors (respectively 118.1, 118.N). In case where there are more than two sub-circuits, the current sourcing capability of each transconductance cell may be limited, such that the sum of current sourcing limits of all transconductance cells in all the sub-circuits minus the current sourcing limit of the transconductance cell controlling the output, may be less than the maximum emitter current of the transistor driving the output voltage (118.1 here).

Figure 2A:
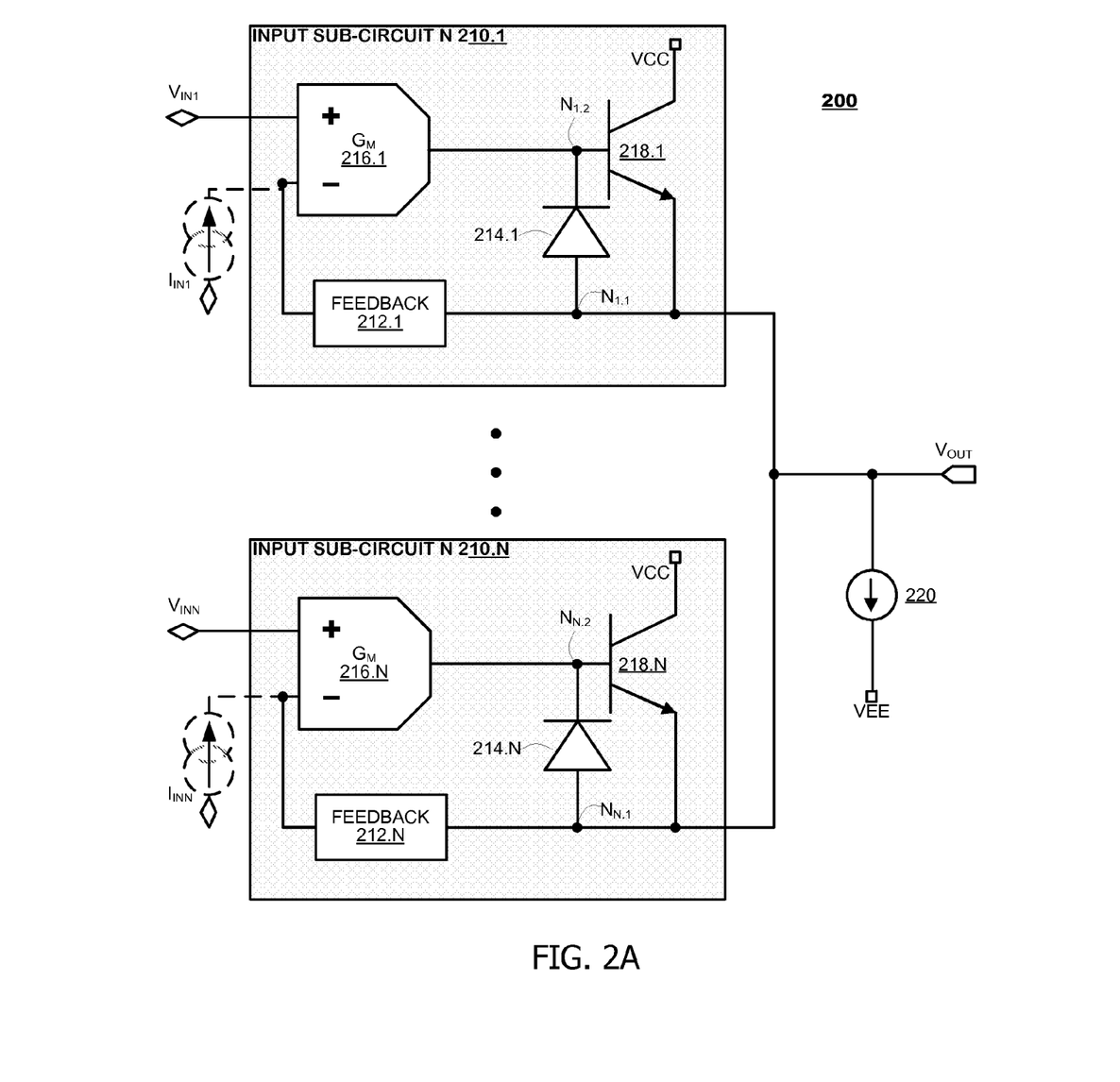
FIG. 2A illustrates a circuit according to an embodiment of the present disclosure.

FIG. 2A illustrates a multi-input maximum output voltage selector circuit 200 according to an embodiment of the present disclosure. In the embodiment, the circuit 200 may include a plurality of commonly-constructed input sub-circuits 210.1-210.N, each coupled to a respective input voltage signal $V_{IN1}$-$V_{INN}$. Each input sub-circuits 210.1-210.N may include respective input current signal $I_{IN1}$-$I_{INN}$. The input sub-circuits 210.1-210.N may have outputs (shown as $N_{1.1}$, ..., $N_{N.1}$ respectively) that are coupled to a common output node $V_{OUT}$. A bias current source 220 may be coupled to a common output node $V_{OUT}$. In the example of FIG. 2A, only two input sub-circuits are shown in detail but the principles of the present invention may include an arbitrary number of N input sub-circuits (not shown).

Each input sub-circuit (for example, stage 210.1) may include a transconductance cell 216.1, a diode 214.1, a feedback circuit 212.1, and a voltage follower 218.1. The transconductance cell 216.1 may have a non-inverting input coupled to a terminal for an input voltage signal $V_{IN1}$ and an inverting input coupled to a terminal for an input current signal $I_{IN1}$. An output of the transconductance cell (shown as node $N_{1.2}$) may be coupled to a voltage input of the voltage follower 218.1 and to the cathode of the diode 214.1. The anode of the diode 214.1 (node $N_{1.1}$) may be connected to the output node $V_{OUT}$, to the feedback circuit 212.1 and to a voltage output of the voltage follower 218.1. A second terminal of the feedback circuit 212.1 may be connected to an inverting input of the transconductance cell 216.1. The voltage follower 218.1 may return current injected into the input sub-circuit's output $N_{1.1}$ to a reference voltage shown as VCC.

Feedback circuits 212.1-212.N of the input sub-circuits 210.1-210.N may determine a transfer function for each input sub-circuit 210.1-210.N that is imparted to input signals $V_{IN1}$-$V_{INN}$ and $I_{IN1}$-$I_{INN}$. Therefore, feedback circuits 212.1-212.N, and input signals $V_{IN1}$-$V_{INN}$ and $I_{IN1}$-$I_{INN}$ may determine the voltage being driven by an input sub-circuit on output node $V_{OUT}$. The transfer function of each input sub-circuit may include delays, multiplication, clamping, amplification, integration, differentiation, filtering, etc.

Consider the circuit 200 operating according to Eq. 2, where input sub-circuit 210.1 drives its output node $N_{1.1}$ toward a potential output voltage that is higher than the output voltages driven by the other input sub-circuits. Since all the output nodes of the input sub-circuits are coupled together at node $V_{OUT}$, the input sub-circuits will compete to set overall output voltage of the common node $V_{OUT}$. Due to their high current sourcing nature, each voltage follower 218.1-218.N may only actively pull up the voltage of the common node $V_{OUT}$ toward the respective potential output voltages of the input sub-circuits. Thus, the voltage at node $V_{OUT}$ may only be the maximum of the output voltages driven by the input sub-circuits, in this case the output voltage driven by input sub-circuit 210.1. Since all input sub-circuits other than 210.1 may be trying to drive the voltage at node $V_{OUT}$ to lower potential output voltages, the respective transconductance cells of all input sub-circuits other than 210.1 may sink a limited current to pull down the input voltage of their respective voltage followers. As a result, the voltage follower 218.1 may be on, while all others may be off, diode 214.1 may be reversed biased, while all other diodes may be forward biased. Thus, input sub-circuit 210.1 may be considered as active, while all other sub-circuits may be considered as inactive. The forward biased diodes 214.1-214.N may clamp the voltage input of the respective voltage followers 218.1-218.N in the inactive input sub-circuits at approximately the output $V_{OUT}$-VF (where VF represents the forward biasing voltage of the respective diodes 214.1-214.N) and may channel the limited current sank by transconductance cell 216.N (and from other transconductance cells of all other inactive input sub-circuits) to output node $V_{OUT}$ and to the output of voltage follower 218.1. The voltage follower 218.1 may channel the current in the forward biased diodes 214.1-214.N to voltage node VCC.

Figure 2B:
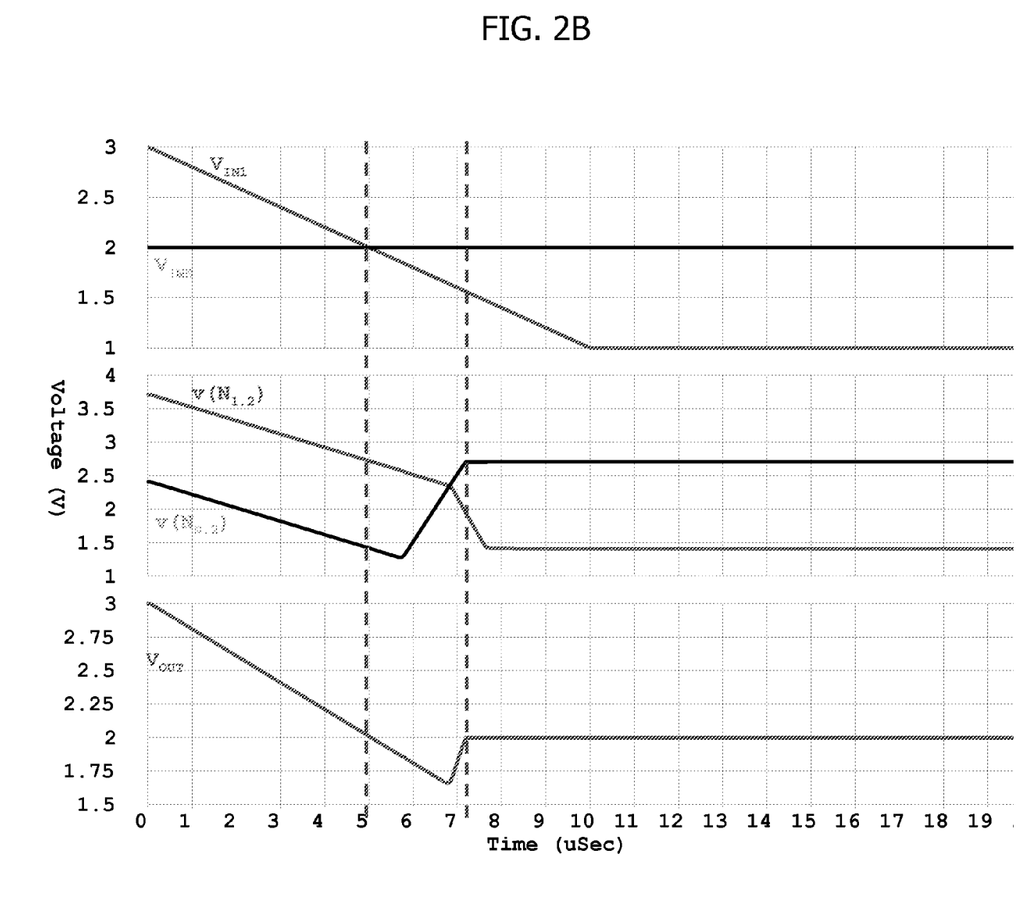
FIG. 2B illustrates a plot of voltage switching characteristics of the circuit of FIG. 2A according to an embodiment of the present disclosure.

FIG. 2B illustrates an exemplary plot of voltage switching characteristics of the circuit 200 of FIG. 2A according to an embodiment of the present disclosure, where the feedback circuit may be a wire, and there are two sub-circuits, N=2. Thus, the circuit performs the function of a selector of the lower of two input voltages (respectively $V_{IN1}$ and $V_{INN}$).

The top plot of FIG. 2B illustrates the input voltage $V_{IN1}$ being swept from 3 volts to 1 volt, and $V_{INN}$ being held constant at 2 volts. The middle plot of FIG. 2B illustrates that the intermediate outputs (respectively $N_{1.2}$, $N_{N.2}$) quickly cross each other in voltage and transitions in voltage after the input voltage $V_{IN1}$ crosses input voltage $V_{INN}$. The intermediate outputs (respectively $N_{1.2}$, $N_{N.2}$) also do not rise or fall near the supply voltage potentials, and may be generally clamped near the voltage of common output node $V_{OUT}$, because of the operation of the diodes. The lower plot of FIG. 2B illustrates that the voltage of common node $V_{OUT}$ settles at the maximum voltage between $V_{IN1}$ and $V_{INN}$ after a small transition period (between two vertical dash lines) after the input voltage $V_{IN1}$ crosses input voltage $V_{INN}$.

For example, as $V_{IN1}$ falls from 3 volts toward 2 volts between 0 and 5 uSec, the voltage of intermediate output $N_{1.2}$ may fall from 3.7 volts toward 2.7 volts to track generally to $V_{IN1}$. During that time period, because $V_{INN}$ is lower than $V_{IN1}$, the voltage follower 218.1 may be on, the voltage follower 218.N may be off, the voltage of intermediate output $N_{N.2}$ may be clamped by the diode 214.N at approximately $V_{OUT}$-VF, and the output $V_{OUT}$ may be set at approximately $V_{IN1}$. The voltage of intermediate output $N_{N.2}$ may fall lower than $V_{INN}$, due to the forward biasing voltage VF of the diode 214.N.

Between 5 and 7 uSec, as $V_{IN1}$ falls below $V_{INN}$, the voltage at the non-inverting terminal of the transconductance cell 216.N rises above the voltage at its inverting terminal. Thus, the transconductance cell 216.N pulls up the voltage of node $N_{N.2}$. Increasing the voltage at $N_{N.2}$ with respect to $V_{OUT}$, turns on the voltage follower 218.N and turns off the diode 214.N. The voltage follower 218.N pulls the voltage of node $V_{OUT}$ up to approximately equal to $V_{INN}$. As the voltage $V_{OUT}$ rises above $V_{IN1}$, the voltage at the inverting terminal of the transconductance cell 216.1 rises above the voltage at its non-inverting terminal. Therefore, the transconductance cell 216.1 pulls down the voltage of intermediate output $N_{1.2}$, the voltage follower 218.1 turns off, and the diode 214.1 forward biases.

Beyond 7 uSec, as $V_{IN1}$ falls further below $V_{INN}$, the voltage of intermediate output $N_{N.2}$ begins to track $V_{OUT}$ and $V_{INN}$. As the diode 214.1 forward biases and input sub-circuit 210.N takes control of the output $V_{OUT}$, the voltage of intermediate output $N_{1.2}$ is clamped by the diode 214.1 at approximately $V_{OUT}$–VF.

According to an embodiment, the voltage followers 218.1-218.N may include a NPN Bipolar Junction Transistor (NPN transistor, transistor, BJT). The output (respectively $N_{1.2}$, $N_{N.2}$) of the transconductance cell may be connected to the cathode of a diode (respectively 214.1, 214.N), and to the base of a NPN Bipolar Junction Transistor (respectively 218.1, 218.N). The collector of the BJT may be connected to a high potential voltage supply (VCC). The anode of the diode (respectively 214.1, 214.N) may be connected to the other terminal of the feedback circuit (respectively 212.1, 212.N), to the emitter of the BJT, to the output of the sub-circuit (respectively $N_{1.1}$, $N_{N.1}$), and to the common output ($V_{OUT}$).

In another embodiment, the voltage followers (respectively 218.1, 218.N) may include a N-type Metal-Oxide-Semiconductor Field Effect transistor (NMOSFET) or a N-channel Junction Field-Effect Transistor (N-JFET) or other types of Field-Effect Transistor (FET), where the gate of the MOSFET or JFET transistor may be connected to the output of the transconductance cell, the source may be connected to the common output node, and the drain may be connected to the reference voltage VCC.

In another embodiment, the diodes (respectively 214.1, 214.N) may each be provided by a diode connected transistor. For example, each diode may be a P-type MOSFET or a P-channel JFET with a drain connected to a gate as a cathode of the diode, and a source as an anode of the diode, or alternatively, a N-type MOSFET or a N-channel JFET with a drain connected to a gate as an anode of the diode, and a source as a cathode of the diode. Each diode may be a PNP Bipolar Junction Transistor with the collector and the base connected as a cathode of the diode, and an emitter connected as an anode, or alternatively, a NPN Bipolar transistor with the collector and the base connected as a cathode of the diode, and an emitter connected as an anode.

MOS transistor implementation of the circuit in accordance with the embodiments of the present disclosure may allow integration of the circuit components on semiconductor chips, by using a CMOS semiconductor manufacturing process, to reduce size and cost of the circuit and the overall system.

Each transconductance cell (respectively 216.1, 216.N) may generate an output current at its output node (respectively $N_{1.1}$, $N_{N.1}$) proportional to the differential input voltage presented to it up to a design limit, and may limit current sinking, i.e. limits the generated output current flowing into the transconductance cell to be significantly lower than the maximum emitter current of the transistors (respectively 218.1, 218.N). In case where there are more than two sub-circuits, the current sinking capability of each transconductance cell may be limited, such that the sum of current sinking limits of all transconductance cells in all the sub-circuits minus the current sinking limit of the transconductance cell controlling the output, may be less than the maximum emitter current of the transistor driving the output voltage (218.1 here).

Figure 3A:
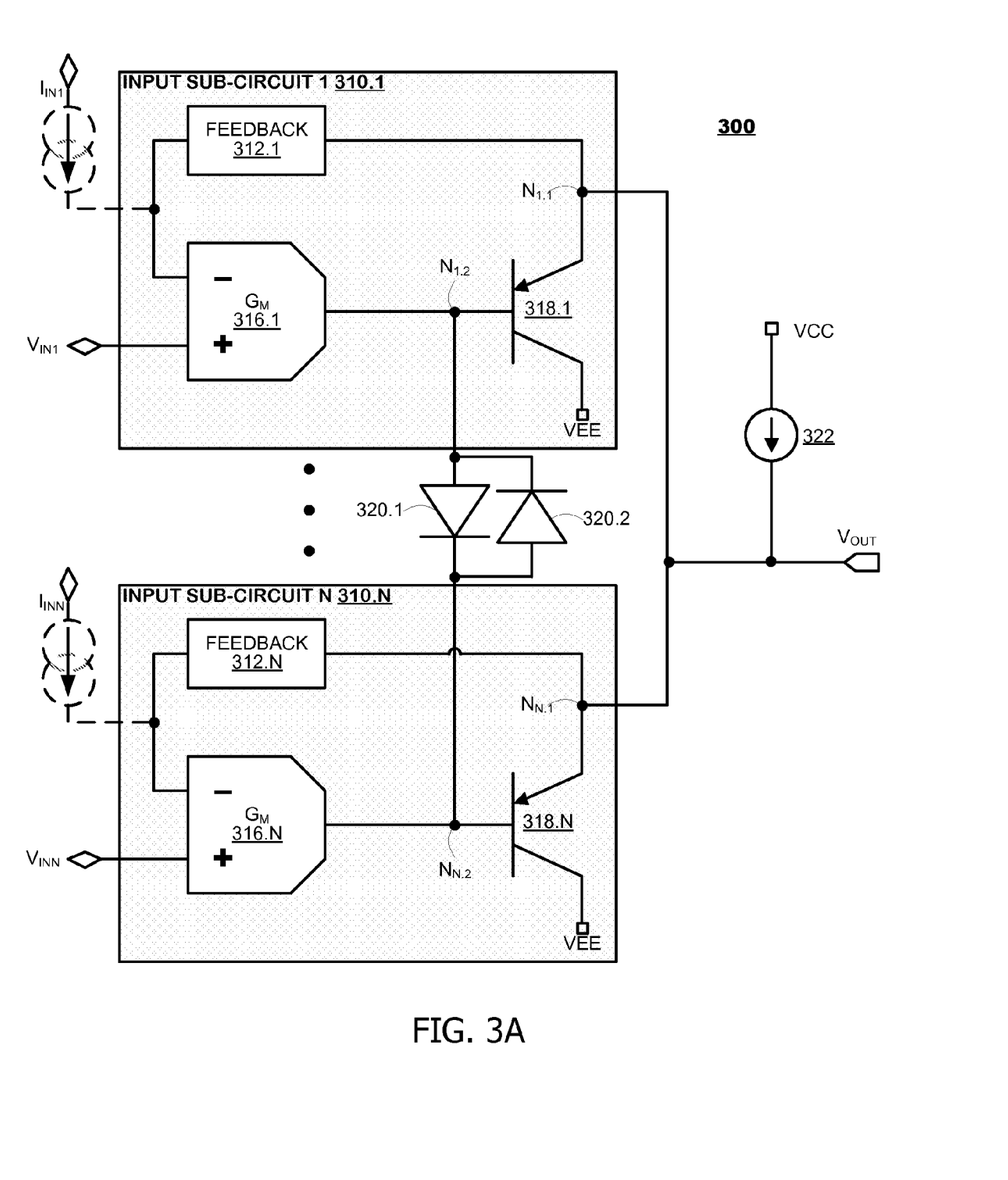
FIG. 3A illustrates a circuit according to an embodiment of the present disclosure.

FIG. 3A illustrates a multi-input minimum output voltage selector circuit 300 according to an embodiment of the present disclosure. In the embodiment, the circuit 300 may include a plurality of commonly-constructed input sub-circuits 310.1-310.N, each coupled to a respective input voltage signal $V_{IN1}$-$V_{INN}$. Each input sub-circuits 310.1-310.N may include respective input current signal The input sub-circuits 310.1-310.N may have outputs (shown as $N_{1.1}, \ldots, N_{N.1}$ respectively) that are coupled to a common output node $V_{OUT}$. A bias current source 322 may be coupled to a common output node $V_{OUT}$. In the example of FIG. 3A, only two input sub-circuits are shown in detail but the principles of the present invention may include an arbitrary number of N input sub-circuits (not shown).

Each input sub-circuit (for example, stage 310.1) may include a transconductance cell 316.1, a feedback circuit 312.1, and a voltage follower 318.1. The transconductance cell 316.1 may have a non-inverting input coupled to a terminal for an input voltage signal $V_{IN1}$ and an inverting input coupled to a terminal for an input current signal $I_{IN1}$. An output of the transconductance cell (shown as node $N_{1.2}$) may be coupled to a voltage input of the voltage follower 318.1. The node $N_{1.1}$ may be connected to the output node $V_{OUT}$, to the feedback circuit 312.1 and to a voltage output of the voltage follower 318.1. A second terminal of the feedback circuit 312.1 may be connected to an inverting input of the transconductance cell 316.1. The voltage follower 318.1 may return current injected into the input sub-circuit's output $N_{1.1}$ to a reference voltage shown as VEE.

The multi-input selector circuit 300 may be nearly identical to the circuit 100 in FIG. 1A, except now containing pairs of diodes (320.1, 320.2 as one pair here) connected in parallel with opposite polarity to the other diode in the each pair, between the respective outputs of the transconductance cells of every pair combination of sub-circuits. In other words, if there are three sub-circuits with three transconductance cells, there may be three pairs of diodes connecting between the outputs of the transconductance cells of three pairs of sub-circuits. If there are four sub-circuits, there may be six pairs of diodes connecting between the outputs of the transconductance cells of six pairs of sub-circuits.

The number of pairs of diodes (represented as Xdiode_pair) needed for N number of sub-circuits may be expressed as:

$$X\text{diode\_pair} = N!/((N-2)! * 2), \text{ (for } N >= 2, \text{ where } a! = 1 \times 2 \times 3 \times \ldots \times a, \text{ and } 0! = 1).$$

Feedback circuits 312.1-312.N of the input sub-circuits 310.1-310.N may determine a transfer function for each input sub-circuit 310.1-310.N that is imparted to input signals $V_{IN1}$-$V_{INN}$ and $I_{IN1}$-$I_{INN}$. Therefore, feedback circuits 312.1-312.N, and input signals $V_{IN1}$-$V_{INN}$ and may determine the voltage being driven by an input sub-circuit on output node $V_{OUT}$. The transfer function of each input sub-circuit may include delays, multiplication, clamping, amplification, integration, differentiation, filtering, etc.

Consider the circuit 300 operating according to Eq. 1, where input sub-circuit 310.1 drives its output node $N_{1.1}$ toward a potential output voltage that is lower than the output voltages driven by the other input sub-circuits. Since all the output nodes of the input sub-circuits are coupled together at node $V_{OUT}$, the input sub-circuits will compete to set overall output voltage of the common node $V_{OUT}$. Due to their high current sinking nature, each voltage follower 318.1-318.N may only actively pull down the voltage of the common node $V_{OUT}$ toward the respective potential output voltages of the input sub-circuits. Thus, the voltage at node $V_{OUT}$ may only be the minimum of the output voltages driven by the input sub-circuits, in this case the output voltage driven by input sub-circuit 310.1. Since all input sub-circuits other than 310.1 may be trying to drive the voltage at node $V_{OUT}$ to higher potential output voltages, the respective transconductance cells of all input sub-circuits other than 310.1 may source a limited current to pull up the input voltage of their respective voltage followers. As a result, the voltage follower 318.1 may be on, while all others may be off. Thus, input sub-circuit 310.1 may be considered as active, while all other sub-circuits may be considered as inactive. One diode in each diode pair may be forward biased, while the other diode in each diode pair may be reversed biased. In the example here, in diode pair 320.1 and 320.2, diode 320.2 may be forward biased, while diode 320.1 may be reverse biased. The forward biased diodes in each diode pair may clamp the voltage input of the respective inactive voltage followers (here for example, 318.N) in the inactive input sub-circuits at approximately $v(N_{1,2})+VF$ (where VF represents the forward biasing voltage of the respective diodes 320.1 and 320.2) and may channel the limited current sourced by transconductance cell 316.N (and from other transconductance cells of all other inactive input sub-circuits) to the output of transconductance cell of the active input sub-circuit (here for example, 316.1). The voltage follower 318.1 may drive the common node $V_{OUT}$ to track voltage of $N_{1,2}$ of the active input sub-circuit 316.1.

Figure 3B:
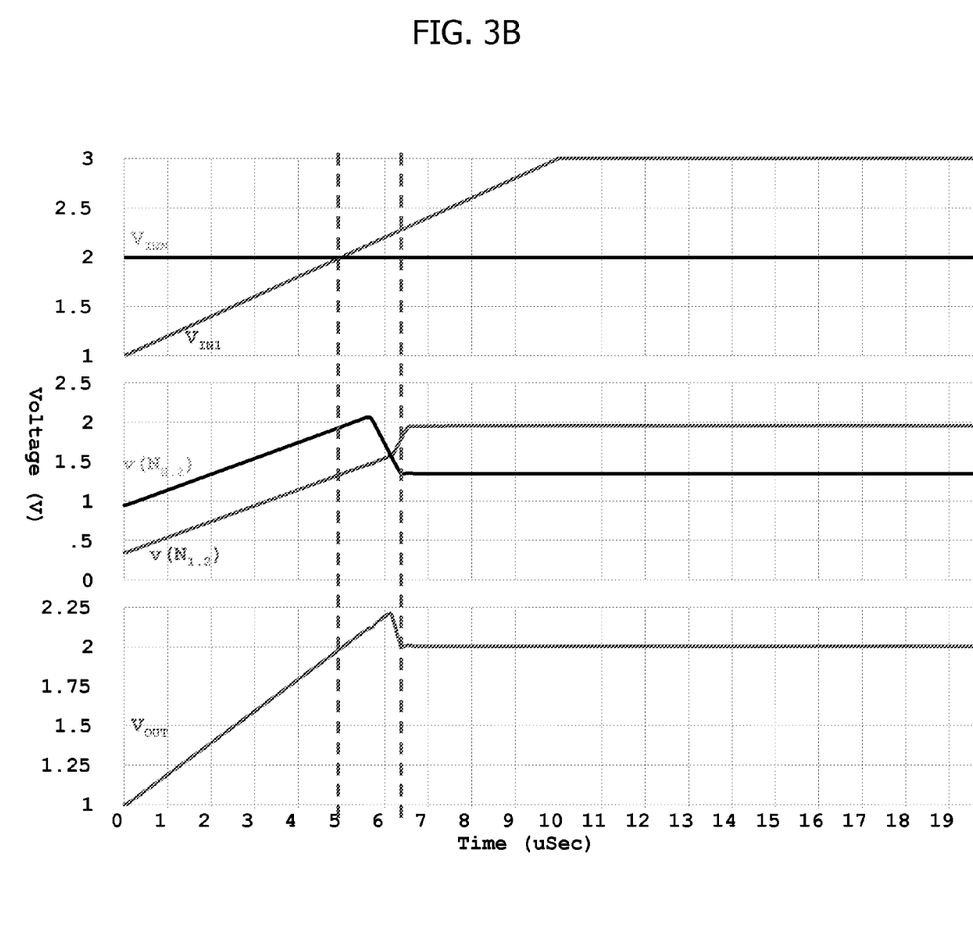
FIG. 3B illustrates a plot of voltage switching characteristics of the circuit of FIG. 3A according to an embodiment of the present disclosure.

FIG. 3B illustrates an exemplary plot of voltage switching characteristics of the circuit 300 of FIG. 3A according to an embodiment of the present disclosure, where the feedback circuit may be a wire, and there are two sub-circuits, N=2. Thus, the circuit performs the function of a selector of the lower of two input voltages (respectively $V_{IN1}$ and $V_{INN}$).

The top plot of FIG. 3B illustrates the input voltage $V_{IN1}$ being swept from 1 volt to 3 volts, and $V_{INN}$ being held constant at 2 volts. The middle plot of FIG. 3B illustrates that the intermediate outputs (respectively $N_{1,2}$, $N_{N,2}$) quickly cross each other in voltage and transitions in voltage after the input voltage $V_{IN1}$ crosses input voltage $V_{INN}$. The intermediate outputs (respectively $N_{1,2}$, $N_{N,2}$) also do not rise or fall near the supply voltage potentials, and may be generally clamped near the voltage of common output node $V_{OUT}$, because of the operation of the diodes. The lower plot of FIG. 3B illustrates that the voltage of common node $V_{OUT}$ settles at the minimum voltage between $V_{IN1}$ and $V_{INN}$ after a small transition period (between two vertical dash lines) after the input voltage $V_{IN1}$ crosses input voltage $V_{INN}$.

For example, as $V_{IN1}$ rises from 1 volt toward 2 volts between 0 and 5 uSec, the voltage of intermediate output $N_{1,2}$ may rise from 0.3 volt toward 1.3 volts to track generally to $V_{IN1}$. During that time period, because $V_{INN}$ is higher than $V_{IN1}$, the voltage follower 318.1 may be on, the voltage follower 318.N may be off, the voltage of intermediate output $N_{N,2}$ is clamped by the diode 320.2 at approximately $v(N_{1,2})+VF$, and the output $V_{OUT}$ may be set at approximately $V_{IN1}$. The voltage of intermediate output $N_{N,2}$ may rise higher than $V_{INN}$, due to the forward biasing voltage VF of the diode 320.2.

Between 5 and 6.5 uSec, as $V_{IN1}$ rises above $V_{INN}$, the voltage at the non-inverting terminal of the transconductance cell 316.N falls below the voltage at its inverting terminal. Thus, the transconductance cell 316.N pulls down the voltage of node $N_{N,2}$. As the voltage $V_{OUT}$ falls below $V_{IN1}$, the voltage at the inverting terminal of the transconductance cell 316.1 falls below the voltage at its non-inverting terminal. Thus, the transconductance cell 316.1 pulls up the voltage of intermediate output $N_{1,2}$. As the voltage at $N_{N,2}$ falls below the voltage at $N_{N,1}$, the diode 320.2 turns off and the diode 320.1 forward biases. The voltage follower 318.1 turns off, and the voltage follower 318.N pulls the voltage of node $V_{OUT}$ down to approximately equal to $V_{INN}$.

Beyond 6.5 uSec, as $V_{IN1}$ rises further above $V_{INN}$, the voltage of intermediate output $N_{N,2}$ begins to track $V_{OUT}$ and $V_{INN}$. As the diode 320.1 forward biases and input sub-circuit 310.N takes control of the output $V_{OUT}$, the voltage of intermediate output $N_{1,2}$ is clamped by the diode 320.1 at approximately $v(N_{N,2})+VF$.

According to an embodiment, the voltage followers 318.1-318.N may include a PNP Bipolar Junction Transistor (PNP transistor, transistor, BJT). The output (respectively $N_{1,2}$, $N_{N,2}$) of the transconductance cell may be connected to one terminal of a diode pair (respectively 320.1, 320.2), (as well as to one terminal of each additional pair of diodes for additional combination pairs of sub-circuits), and to the base of a PNP Bipolar Junction Transistor (respectively 318.1, 318.N). The other terminal of the diode pair (respectively 320.1, 320.2) may be connected to the output (respectively $N_{1,2}$, $N_{N,2}$) of the transconductance cell of another input sub-circuit. The collector of the BJT may be connected to a low potential voltage supply (VEE). The other end of the feedback circuit (respectively 312.1, 312.N) may be connected to the emitter of the BJT, to the output of the sub-circuit (respectively $N_{1,1}$, $N_{N,1}$), and to the common output ($V_{OUT}$).

In another embodiment, the voltage followers (respectively 318.1, 318.N) may include a P-type Metal-Oxide-Semiconductor Field Effect transistor (PMOSFET) or a P-channel Junction Field-Effect Transistor (P-JFET) or other types of Field-Effect Transistor (FET), where the gate of the MOSFET or JFET transistor may be connected to the output of the transconductance cell, the source may be connected to the common output node, and the drain may be connected to the reference voltage VEE.

In another embodiment, the diodes (respectively 320.1, 320.2) may each be provided by a diode connected transistor. For example, each diode may be a P-type MOSFET or a P-channel JFET with a drain connected to a gate as a cathode of the diode, and a source as an anode of the diode, or alternatively, a N-type MOSFET or a N-channel JFET with a drain connected to a gate as an anode of the diode, and a source as a cathode of the diode. Each diode may be a PNP Bipolar Junction Transistor with the collector and the base connected as a cathode of the diode, and an emitter connected as an anode, or alternatively, a NPN Bipolar transistor with the collector and the base connected as a cathode of the diode, and an emitter connected as an anode.

MOS transistor implementation of the circuit in accordance with the embodiments of the present disclosure may allow integration of the circuit components on semiconductor chips, by using a CMOS semiconductor manufacturing process, to reduce size and cost of the circuit and the overall system.

Each transconductance cell (respectively 316.1, 316.N) may generate an output current at its output node (respectively $N_{1,1}$, $N_{N,1}$) proportional to the differential input voltage presented to it up to a design limit, and may limit current sourcing, i.e. limits the generated output current flowing out of the transconductance cell to be significantly lower than the maximum current sinking limit of the transconductance cell of the active input sub-circuit controlling the output voltage (318.1 here). In case where there are more than two sub-circuits, the current sourcing capability of each transconductance cell may be limited, such that the sum of current sourcing limits of all transconductance cells in all the sub-circuits minus the current sourcing limit of the transconductance cell controlling the output, may be less than the maximum current sinking limit of the transconductance cell of the active input sub-circuit controlling the output voltage (318.1 here).

Figure 4A:
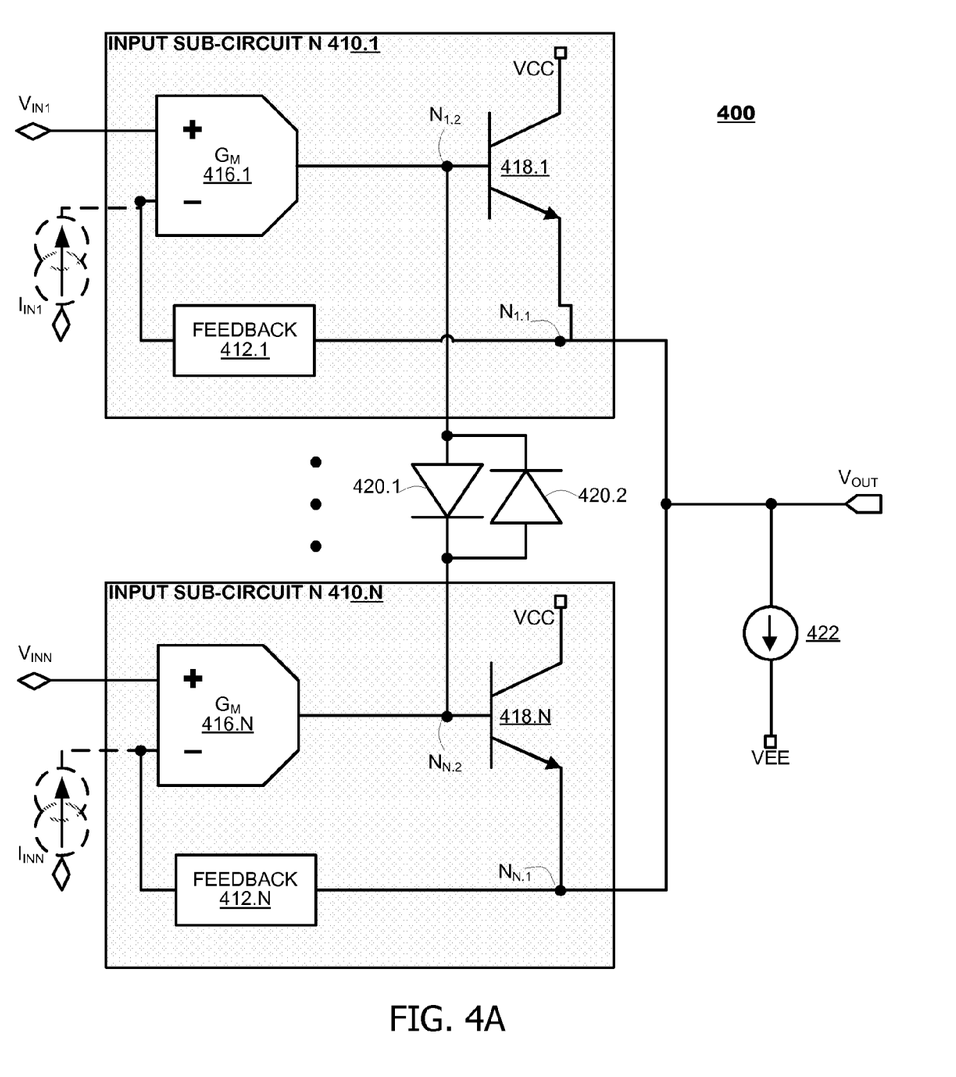
FIG. 4A illustrates a circuit according to an embodiment of the present disclosure.

FIG. 4A illustrates a multi-input maximum output voltage selector circuit 400 according to an embodiment of the present disclosure. In the embodiment, the circuit 400 may include a plurality of commonly-constructed input sub-circuits 410.1-410.N, each coupled to a respective input voltage signal $V_{IN1}$-$V_{INN}$. Each input sub-circuits 410.1-410.N may include respective input current signal $I_{IN1}$-$I_{INN}$. The input sub-circuits 410.1-410.N may have outputs (shown as $N_{1.1}, \ldots, N_{N.1}$ respectively) that are coupled to a common output node $V_{OUT}$. A bias current source 422 may be coupled to a common output node $V_{OUT}$. In the example of FIG. 4A, only two input sub-circuits are shown in detail but the principles of the present invention may include an arbitrary number of N input sub-circuits (not shown).

Each input sub-circuit (for example, stage 410.1) may include a transconductance cell 416.1, a feedback circuit 412.1, and a voltage follower 418.1. The transconductance cell 416.1 may have a non-inverting input coupled to a terminal for an input voltage signal $V_{IN1}$ and an inverting input coupled to a terminal for an input current signal $I_{IN1}$. An output of the transconductance cell (shown as node $N_{1.2}$) may be coupled to a voltage input of the voltage follower 418.1. The node $N_{1.1}$ may be connected to the output node $V_{OUT}$, to the feedback circuit 412.1 and to a voltage output of the voltage follower 418.1. A second terminal of the feedback circuit 412.1 may be connected to an inverting input of the transconductance cell 416.1. The voltage follower 418.1 may return current injected into the input sub-circuit's output $N_{1.1}$ to a reference voltage shown as VCC.

The multi-input selector circuit 400 may be nearly identical to the circuit 100 in FIG. 1A, except now containing pairs of diodes (420.1, 420.2 as one pair here) connected in parallel with opposite polarity to the other diode in the each pair, between the respective outputs of the transconductance cells of every pair combination of sub-circuits. In other words, if there are three sub-circuits with three transconductance cells, there may be three pairs of diodes connecting between the outputs of the transconductance cells of three pairs of sub-circuits. If there are four sub-circuits, there may be six pairs of diodes connecting between the outputs of the transconductance cells of six pairs of sub-circuits.

The number of pairs of diodes (represented as Xdiode_pair) needed for N number of sub-circuits may be expressed as:

$$X\text{diode\_pair} = N!/((N-2)! * 2), \text{ (for } N >= 2, \text{ where } a! = 1 \times 2 \times 3 \times \ldots \times a, \text{ and } 0! = 1).$$

Feedback circuits 412.1-412.N of the input sub-circuits 410.1-410.N may determine a transfer function for each input sub-circuit 410.1-410.N that is imparted to input signals $V_{IN1}$-$V_{INN}$ and $I_{IN1}$-$I_{INN}$. Therefore, feedback circuits 412.1-412.N, and input signals $V_{IN1}$-$V_{INN}$ and $I_{IN1}$-$I_{INN}$ may determine the voltage being driven by an input sub-circuit on output node $V_{OUT}$. The transfer function of each input sub-circuit may include delays, multiplication, clamping, amplification, integration, differentiation, filtering, etc.

Consider the circuit 400 operating according to Eq. 2, where input sub-circuit 410.1 drives its output node $N_{1.1}$ toward a potential output voltage that is higher than the output voltages driven by the other input sub-circuits. Since all the output nodes of the input sub-circuits are coupled together at node $V_{OUT}$, the input sub-circuits will compete to set overall output voltage of the common node $V_{OUT}$. Due to their high current sourcing nature, each voltage follower 418.1-418.N may only actively pull up the voltage of the common node $V_{OUT}$ toward the respective potential output voltages of the input sub-circuits. Thus, the voltage at node $V_{OUT}$ may only be the maximum of the output voltages driven by the input sub-circuits, in this case the output voltage driven by input sub-circuit 410.1. Since all input sub-circuits other than 410.1 may be trying to drive the voltage at node $V_{OUT}$ to lower potential output voltages, the respective transconductance cells of all input sub-circuits other than 410.1 may sink a limited current to pull down the input voltage of their respective voltage followers. As a result, the voltage follower 418.1 may be on, while all others may be off. Thus, input sub-circuit 410.1 may be considered as active, while all other sub-circuits may be considered as inactive. One diode in each diode pair may be forward biased, while the other diode in each diode pair may be reversed biased. In the example here, in diode pair 420.1 and 420.2, diode 420.1 may be forward biased, while diode 420.2 may be reverse biased. The forward biased diodes in each diode pair may clamp the voltage input of the respective inactive voltage followers (here for example, 418.N) in the inactive input sub-circuits at approximately $v(N_{1.2}) - VF$ (where VF represents the forward biasing voltage of the respective diodes 420.1 and 420.2) and may channel the limited current sank by transconductance cell 416.N (and from other transconductance cells of all other inactive input sub-circuits) to the output of transconductance cell of the active input sub-circuit (here for example, 416.1). The voltage follower 418.1 may drive the common node $V_{OUT}$ to track voltage of $N_{1.2}$ of the active input sub-circuit 416.1.

Figure 4B:
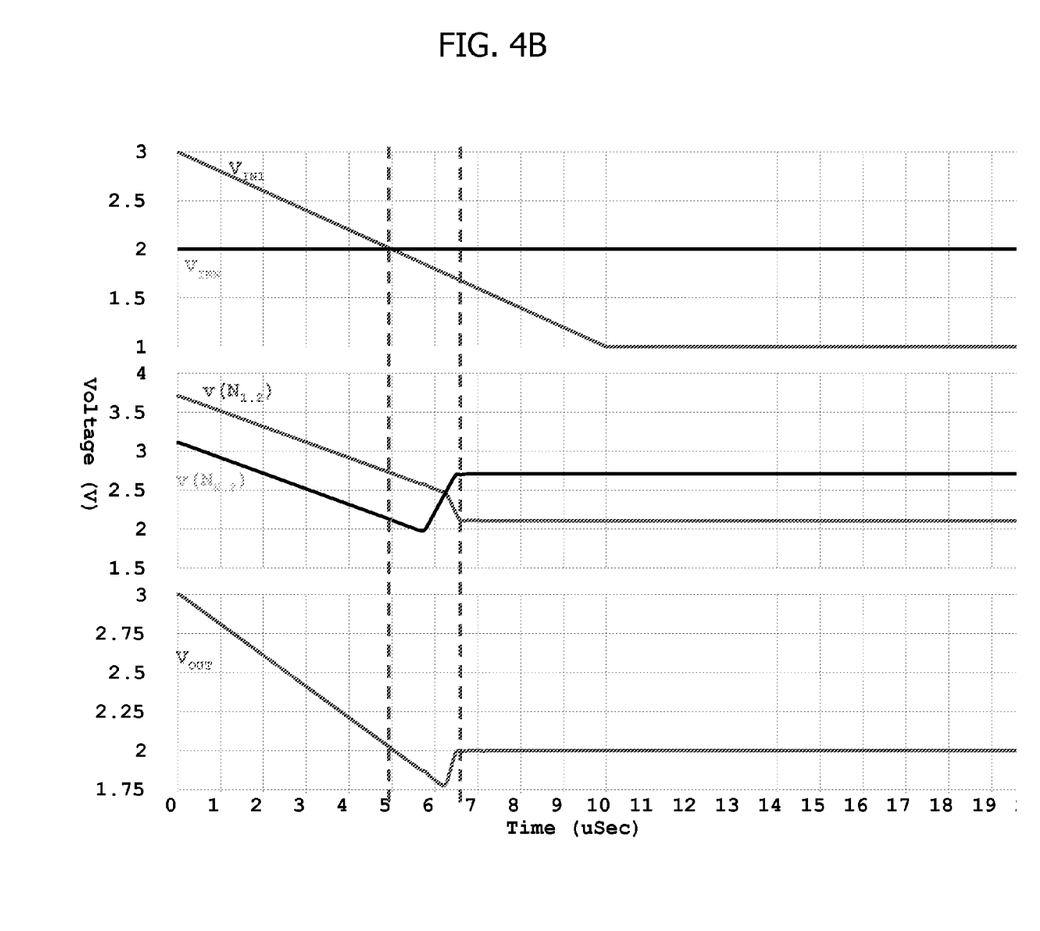
FIG. 4B illustrates a plot of voltage switching characteristics of the circuit of FIG. 4A according to an embodiment of the present disclosure.

FIG. 4B illustrates an exemplary plot of voltage switching characteristics of the circuit 400 of FIG. 4A according to an embodiment of the present disclosure, where the feedback circuit may be a wire, and there are two sub-circuits, N=2. Thus, the circuit performs the function of a selector of the lower of two input voltages (respectively $V_{IN1}$ and $V_{INN}$).

The top plot of FIG. 4B illustrates the input voltage $V_{IN1}$ being swept from 3 volts to 1 volt, and $V_{INN}$ being held constant at 2 volts. The middle plot of FIG. 4B illustrates that the intermediate outputs (respectively $N_{1.2}$, $N_{N.2}$) quickly cross each other in voltage and transitions in voltage after the input voltage $V_{IN1}$ crosses input voltage $V_{INN}$. The intermediate outputs (respectively $N_{1.2}$, $N_{N.2}$) also do not rise or fall near the supply voltage potentials, and may be generally clamped near the voltage of common output node $V_{OUT}$, because of the operation of the diodes. The lower plot of FIG. 4B illustrates that the voltage of common node $V_{OUT}$ settles at the maximum voltage between $V_{IN1}$ and $V_{INN}$ after a small transition period (between two vertical dash lines) after the input voltage $V_{IN1}$ crosses input voltage $V_{INN}$.

For example, as $V_{IN1}$ falls from 3 volts toward 2 volts between 0 and 5 uSec, the voltage of intermediate output $N_{1.2}$ may fall from 3.7 volts toward 2.7 volts to track generally to $V_{IN1}$. During that time period, because $V_{INN}$ is lower than $V_{IN1}$, the voltage follower 418.1 may be on, the voltage follower 418.N may be off, the voltage of intermediate output $N_{N.2}$ is clamped by the diode 420.1 at approximately $v(N_{1.2}) - VF$, and the output $V_{OUT}$ may be set at approximately $V_{IN1}$.

The voltage of intermediate output $N_{N.2}$ may fall lower than $V_{INN}$, due to the forward biasing voltage VF of the diode 420.2.

Between 5 and 6.5 uSec, as $V_{IN1}$ falls below $V_{INN}$, the voltage at the non-inverting terminal of the transconductance cell 416.N rises above the voltage at its inverting terminal. Thus, the transconductance cell 416.N pulls up the voltage of node $N_{N.2}$. As the voltage $V_{OUT}$ rises above $V_{IN1}$, the voltage at the inverting terminal of the transconductance cell 416.1 rises above the voltage at its non-inverting terminal. Thus, the transconductance cell 416.1 pulls down the voltage of intermediate output $N_{1.2}$. As the voltage at $N_{N.2}$ rises above the voltage at $N_{N.1}$, the diode 420.1 turns off and the diode 420.2 forward biases. The voltage follower 418.1 turns off, and the voltage follower 418.N pulls the voltage of node $V_{OUT}$ up to approximately equal to $V_{INN}$.

Beyond 7 uSec, as $V_{IN1}$ falls further below $V_{INN}$, the voltage of intermediate output $N_{N.2}$ begins to track $V_{OUT}$ and $V_{INN}$. As the diode 420.2 forward biases and input sub-circuit 410.N takes control of the output $V_{OUT}$, the voltage of intermediate output $N_{1.2}$ is clamped by the diode 420.2 at approximately $v(N_{N.2})-VF$.

According to an embodiment, the voltage followers 418.1-418.N may include a NPN Bipolar Junction Transistor (NPN transistor, transistor, BJT). The output (respectively $N_{1.2}$, $N_{N.2}$) of the transconductance cell may be connected to one terminal of a diode pair (respectively 420.1, 420.2), (as well as to one terminal of each additional pair of diodes for additional combination pairs of sub-circuits), and to the base of a NPN Bipolar Junction Transistor (respectively 418.1, 418.N). The other terminal of the diode pair (respectively 420.1, 420.2) may be connected to the output (respectively $N_{1.2}$, $N_{N.2}$) of the transconductance cell of another input sub-circuit. The collector of the BJT may be connected to a high potential voltage supply (VCC). The other end of the feedback circuit (respectively 412.1, 412.N) may be connected to the emitter of the BJT, to the output of the sub-circuit (respectively $N_{1.1}$, $N_{N.1}$), and to the common output ($V_{OUT}$).

In another embodiment, the voltage followers (respectively 418.1, 418.N) may include a N-type Metal-Oxide-Semiconductor Field Effect transistor (NMOSFET) or a N-channel Junction Field-Effect Transistor (N-JFET) or other types of Field-Effect Transistor (FET), where the gate of the MOSFET or JFET transistor may be connected to the output of the transconductance cell, the source may be connected to the common output node, and the drain may be connected to the reference voltage VCC.

In another embodiment, the diodes (respectively 420.1, 420.2) may each be provided by a diode connected transistor. For example, each diode may be a P-type MOSFET or a P-channel JFET with a drain connected to a gate as a cathode of the diode, and a source as an anode of the diode, or alternatively, a N-type MOSFET or a N-channel JFET with a drain connected to a gate as an anode of the diode, and a source as a cathode of the diode. Each diode may be a PNP Bipolar Junction Transistor with the collector and the base connected as a cathode of the diode, and an emitter connected as an anode, or alternatively, a NPN Bipolar transistor with the collector and the base connected as a cathode of the diode, and an emitter connected as an anode.

MOS transistor implementation of the circuit in accordance with the embodiments of the present disclosure may allow integration of the circuit components on semiconductor chips, by using a CMOS semiconductor manufacturing process, to reduce size and cost of the circuit and the overall system.

Each transconductance cell (respectively 416.1, 416.N) may generate an output current at its output node (respectively $N_{1.1}$, $N_{N.1}$) proportional to the differential input voltage presented to it up to a design limit, and may limit current sinking, i.e. limits the generated output current flowing out of the transconductance cell to be significantly lower than the maximum current sourcing limit of the transconductance cell of the active input sub-circuit controlling the output voltage (418.1 here). In case where there are more than two sub-circuits, the current sinking capability of each transconductance cell may be limited, such that the sum of current sinking limits of all transconductance cells in all the sub-circuits minus the current sinking limit of the transconductance cell controlling the output, may be less than the maximum current sourcing limit of the transconductance cell of the active input sub-circuit controlling the output voltage (418.1 here).

Figure 5:
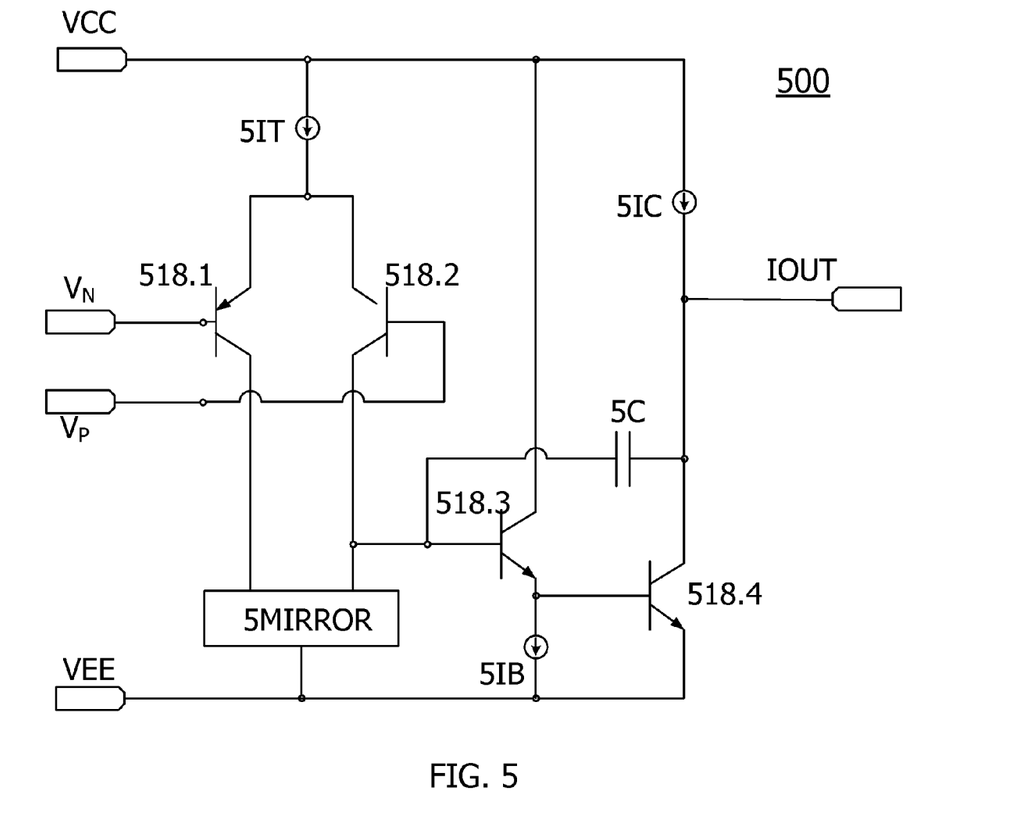
FIG. 5 illustrates an exemplary transconductance cell according to an embodiment of the present disclosure.

FIG. 5 illustrates an exemplary transconductance cell according to an embodiment of the present disclosure.

FIG. 5 illustrates an exemplary two stage transconductance cell 500, for use in an exemplary circuit (such as in FIGS. 1A and 3A), according to an embodiment of the present disclosure.

The exemplary transconductance cell 500 may be powered by a positive voltage supply (VCC) and a negative voltage supply (VEE), and may have a non-inverting voltage input ($V_P$) and an inverting voltage input ($V_N$). The transconductance cell 500 may have a pair of PNP BJT's (respectively 518.1, 518.N) with their respective emitters connected to each other, and connected to a current source (5IT), which may be connected to VCC. The bases of the BJT's (518.1 and 518.N) may be respectively connected to the inverting and non-inverting voltage inputs ($V_P$ and $V_N$). The collectors of the BJT's (518.1 and 518.N) may be respectively connected to the input and output terminals of a current mirror (5MIRROR), which may be connected to VEE.

A NPN BJT (518.3) may have its base connected to the output terminal of current mirror (5MIRROR). The emitter of the BJT (518.3) may be connected to a current source (5IB), which may be connected to VEE. The collector of the BJT (518.3) may be connected to VCC.

A NPN BJT (518.4) may have its base connected to the emitter of the BJT (518.3), its emitter connected to VEE, and its collector connected to a current source (5IC), which may be connected to VCC. A compensation capacitor (5C) may have one terminal connected to the base of the BJT (518.3) and the other terminal connected to the collector of the BJT (518.4). The collector of the BJT (518.4) may be connected to an output node (IOUT).

In this exemplary transconductance cell 500, the current source (5IC) may limit current sourcing (current flowing from VCC to IOUT through 5IC), according to an embodiment of the present disclosure, as described in the exemplary circuits (100, 300) in FIGS. 1A and 3A.

Figure 6:
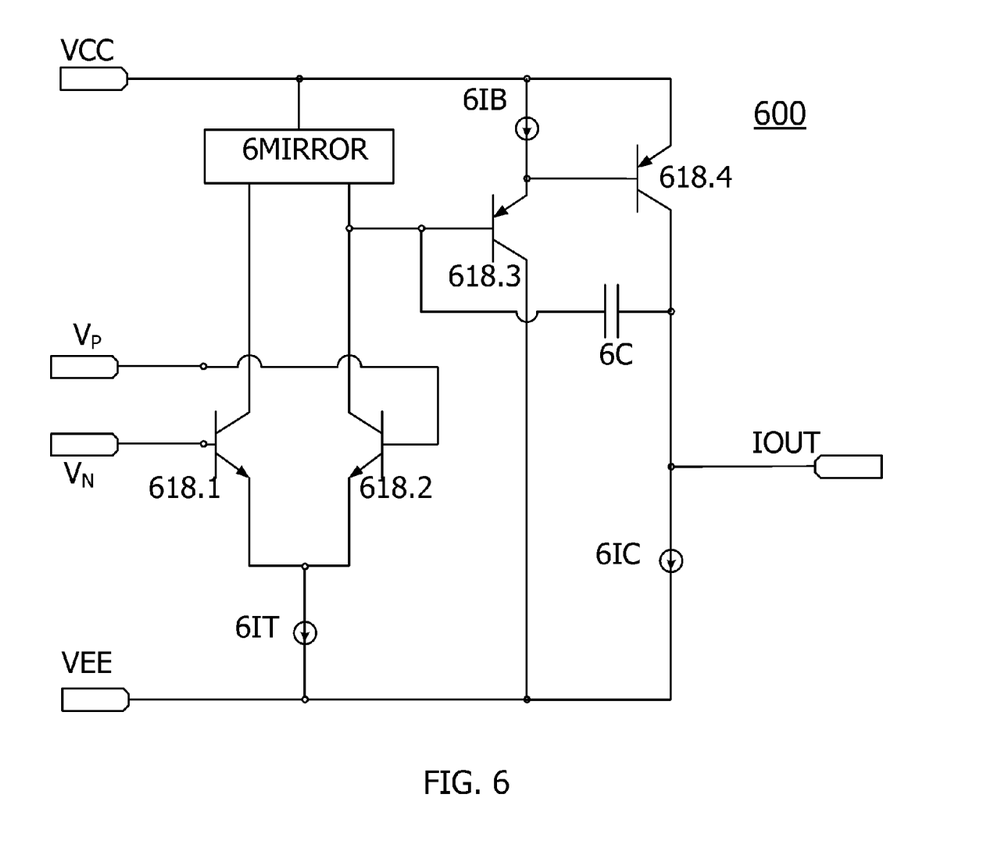
FIG. 6 illustrates another exemplary transconductance cell according to an embodiment of the present disclosure.

FIG. 6 illustrates another exemplary transconductance cell according to an embodiment of the present disclosure.

FIG. 6 illustrates an exemplary two stage transconductance cell 600, for use in an exemplary circuit (such as in FIGS. 2A and 4A), according to an embodiment of the present disclosure.

The exemplary transconductance cell 600 may be powered by a positive voltage supply (VCC) and a negative voltage supply (VEE), and may have a non-inverting voltage input ($V_P$) and an inverting voltage input ($V_N$). The transconductance cell 600 may have a pair of NPN BJT's (respectively 618.1, 618.N) with their respective emitters connected to each other, and connected to a current source (6IT), which may be connected to VEE. The bases of the BJT's (618.1 and 618.N) may be respectively connected to the inverting and non-inverting voltage inputs ($V_P$ and $V_N$). The collectors of the BJT's (618.1 and 618.N) may be respectively connected to the input and output terminals of a current mirror (6MIRROR), which may be connected to VCC.

A PNP BJT (618.3) may have its base connected to of the output terminal of current mirror (6MIRROR). The emitter of the BJT (618.3) may be connected to a current source (6IB), which may be connected to VEE. The collector of the BJT (618.3) may be connected to VCC.

A PNP BJT (618.4) may have its base connected to the emitter of the BJT (618.3), its emitter connected to VEE, and its collector connected to a current source (6IC), which may be connected to VCC. A compensation capacitor (6C) may have one terminal connected to the base of the BJT (618.3) and the other terminal connected to the collector of the BJT (618.4). The collector of the BJT (618.4) may be connected to an output node (IOUT).

In this exemplary transconductance cell 600, the current source (6IC) may limit current sinking (current flowing from IOUT to VEE through 6IC), according to an embodiment of the present disclosure, as described in the exemplary circuits (200, 400) in FIGS. 2A and 4A.

In another embodiment, the NPN BJT's may be replaced by N-type Metal-Oxide-Semiconductor Field Effect Transistors (NMOSFET) or N-channel Junction Field-Effect Transistors (N-JFET) or other types of Field-Effect Transistors (FET), and the PNP BJT's may be replaced by P-type Metal-Oxide-Semiconductor Field Effect transistors (PMOSFET) or P-channel Junction Field-Effect Transistors (P-JFET) or other types of Field-Effect Transistors (FET).

MOS transistor implementation of the circuit in accordance with the embodiments of the present disclosure may allow integration of the circuit components on semiconductor chips, by using a CMOS semiconductor manufacturing process, to reduce size and cost of the circuit and the overall system.

It is appreciated that the disclosure is not limited to the described embodiments, and that any number of scenarios and embodiments may exist.

Although the disclosure has been described with reference to several exemplary embodiments, it is understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means, materials and embodiments, the disclosure is not intended to be limited to the particulars disclosed; rather the disclosure extends to all functionally equivalent structures, methods, and uses such as are within the scope of the appended claims.

Although the present application describes specific embodiments which may be implemented as code segments in computer-readable media, it is to be understood that dedicated hardware implementations, such as application specific integrated circuits, programmable logic arrays and other hardware devices, can be constructed to implement one or more of the embodiments described herein. Applications that may include the various embodiments set forth herein may broadly include a variety of electronic and computer systems. Accordingly, the present application may encompass software, firmware, and hardware implementations, or combinations thereof.

The present specification describes components and functions that may be implemented in particular embodiments with reference to particular standards and protocols, the disclosure is not limited to such standards and protocols. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "disclosure" merely for convenience and without intending to voluntarily limit the scope of this application to any particular disclosure or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

We claim:

1. A circuit system, comprising:
a plurality of input sub-circuits coupled to a common output node, each input sub-circuit comprising:
a transconductance cell having a first input for a respective input signal of a plurality of input signals and an output for an output current signal,
a diode coupled between an output of the transconductance cell and the common output node,
a feedback circuit coupled between the common output node and a second input of the transconductance cell, and a voltage follower having an output coupled to the common output node, an input coupled to the output of the transconductance cell and a common terminal coupled to a reference voltage.

2. The circuit system of claim 1, further comprising a current source coupled to the common output node; wherein the reference voltage is a voltage supply that receives current injected to the common output node.

3. The circuit system of claim 1, wherein the feedback circuit of each input sub-circuit, when activated, processes the respective first input and the second input to drive the common output node toward a respective potential output voltage.

4. The circuit system of claim 3, wherein the diode is oriented to conduct current flowing only from the transconductance cell to the common output node.

5. The circuit system of claim 4, wherein the circuit system selects the minimum voltage among all the respective potential output voltages.

6. The circuit system of claim 3, wherein the diode is oriented to conduct current flowing only from the common output node to the transconductance cell.

7. The circuit system of claim 6, wherein the circuit system selects the maximum voltage among all the respective potential output voltages.

8. The circuit system of claim 1, wherein the voltage follower is one of a bipolar junction transistor, a Metal-Oxide-Semiconductor (MOS) transistor and a Junction Field-Effect transistor (JFET).

9. The circuit system of claim 1, wherein the diode is a junction diode, or a diode-connected transistor.

10. The circuit system of claim 1, wherein the output current signal of the transconductance cell is current limited.

11. The circuit system of claim 1, wherein the feedback circuit performs at least one of delaying, multiplication, clamping, amplification, integration, differentiation, and filtering.

12. A circuit system, comprising:
   at least two input sub-circuits coupled to a common output node, each input sub-circuit comprising:
      a transconductance cell having a first input for a respective input signal of a plurality of input signals and an output for an output current signal,
      a feedback circuit coupled between the common output node and a second input of the transconductance cell, and
      a voltage follower having an output coupled to the common output node, an input coupled to the output of the transconductance cell and a common terminal coupled to a reference voltage; and
   a plurality of diodes connected in parallel with each other and oppositely oriented relative to each other, coupling between outputs of the transconductance cells among each pair of input sub-circuits.

13. The circuit system of claim 12, further comprising a current source coupled to the common output node; wherein the reference voltage is a voltage supply that receives current injected to the common output node.

14. The circuit system of claim 12, wherein the feedback circuit of each input sub-circuit, when activated, processes the respective first input and the second input to drive the common output node toward a respective potential output voltage.

15. The circuit system of claim 14, wherein the circuit system selects the minimum voltage among all the respective potential output voltages.

16. The circuit system of claim 14, wherein the circuit system selects the maximum voltage among all the respective potential output voltages.

17. The circuit system of claim 12, wherein the voltage follower is one of a bipolar junction transistor, a Metal-Oxide-Semiconductor (MOS) transistor and a Junction Field-Effect transistor (JFET).

18. The circuit system of claim 12, wherein the diode is a junction diode, or a diode-connected transistor.

19. The circuit system of claim 12, wherein the output current signal of the transconductance cell is current limited.

20. The circuit system of claim 12, wherein the feedback circuit performs at least one of delaying, multiplication, clamping, amplification, integration, differentiation, and filtering.

* * * * *